United States Patent
Hacker et al.

(10) Patent No.: US 7,029,826 B2
(45) Date of Patent: Apr. 18, 2006

(54) METHOD TO RESTORE HYDROPHOBICITY IN DIELECTRIC FILMS AND MATERIALS

(75) Inventors: Nigel P. Hacker, Palo Alto, CA (US); Michael Thomas, Milpitas, CA (US); James S. Drage, Fremont, CA (US)

(73) Assignee: Honeywell International Inc., Morristown, NJ (US)

( * ) Notice: Subject to any disclaimer, the term of this patent is extended or adjusted under 35 U.S.C. 154(b) by 153 days.

(21) Appl. No.: 10/312,295

(22) PCT Filed: Jun. 19, 2001

(86) PCT No.: PCT/US01/19466

§ 371 (c)(1),
(2), (4) Date: Jul. 18, 2003

(87) PCT Pub. No.: WO02/01621

PCT Pub. Date: Jan. 3, 2002

(65) Prior Publication Data

US 2004/0013858 A1 Jan. 22, 2004

Related U.S. Application Data

(60) Provisional application No. 60/214,219, filed on Jun. 23, 2000.

(51) Int. Cl.
*G03C 5/56* (2006.01)

(52) U.S. Cl. .................... 430/311; 430/314; 430/316; 438/447

(58) Field of Classification Search ............... 430/311, 430/314, 316; 438/447
See application file for complete search history.

(56) References Cited

U.S. PATENT DOCUMENTS

| | | | | |
|---|---|---|---|---|
| 5,079,300 | A | 1/1992 | Dubrow et al. | 525/106 |
| 6,042,994 | A | 3/2000 | Yang et al. | 430/296 |
| 6,208,014 | B1 * | 3/2001 | Wu et al. | 257/629 |
| 6,395,651 | B1 * | 5/2002 | Smith et al. | 438/787 |
| 6,410,149 | B1 * | 6/2002 | Hendricks et al. | 428/447 |
| 2002/0001973 | A1 | 1/2002 | Wu et al. | 438/780 |

FOREIGN PATENT DOCUMENTS

WO  WO 00/02233  1/2000

OTHER PUBLICATIONS

S.V. Nitta, et al., "Surface Modified Spin-On Xerogel Films as Interlayer Dielectrics", 1999 American Vacuum Society, pp. 205-212.

* cited by examiner

*Primary Examiner*—John A. McPherson
*Assistant Examiner*—Deborah Chacko-Davis
(74) *Attorney, Agent, or Firm*—Roberts & Roberts, LLP

(57) ABSTRACT

Silica dielectric films, whether nanoporous foamed silica dielectrics or nonporous silica dielectrics are readily damaged by fabrication methods and reagents that reduce or remove hydrophobic properties from the dielectric surface. The invention provides for methods of imparting hydrophobic properties to such damaged silica dielectric films present on a substrate. The invention also provides plasma-based methods for imparting hydrophobicity to both new and damaged silica dielectric films. Semiconductor devices prepared by the inventive processes are also provided.

16 Claims, 2 Drawing Sheets

METHOD TO RESTORE HYDROPHOBICITY IN DIELECTRIC FILMS AND MATERIALS

CROSS REFERENCE TO RELATED APPLICATION

This application claims the benefit of Provisional patent application Ser. No. 60/214,219 filed Jun. 23,2000.

FIELD OF THE INVENTION

The invention provides methods and compositions for restoring hydrophobicity to the surfaces of silica dielectric films. These films are used as insulating materials in the manufacture of semiconductor devices such as integrated circuits ("ICs") in order to ensure low and stable dielectric properties in these films.

BACKGROUND OF THE INVENTION

As feature sizes in integrated circuits approach 0.25 µm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

Silica Dielectric Films

One material with a low dielectric constant is silica. In particular, silica can be applied as a foamed dielectric material. For the lowest possible dielectric values, air is introduced into silica dielectric mateirals. Air has a dielectric constant of 1, and when air is introduced into a silica dielectric material in the form of nanoporous or nanometer-scale voids or pore structures, relatively low dielectric constants ("k") are achieved.

Nanoporous silica is attractive because it employs similar precursors, including organic-substituted silanes, e.g., tetramethoxysilane ("TMOS") and/or tetraethoxysilane ("TEOS"), as are used for the currently employed spin-on-glasses ("SOG") and chemical vapor disposition ("CVD") silica $SiO_2$.

Nanoporous silica films have previously been fabricated by a number of methods. Simply by way of example, suitable silicon-based precursor compositions and methods for forming nanoporous silica dielectric films by solvent removal, are described, for example, by the following co-owned U.S. patent applications: Ser. No. 09/054,262, filed on Apr. 3, 1998, Ser. No. 09/111,083, filed on Jul. 7, 1998, 60/098,068, filed on Aug. 27, 1998, 60/098,515, filed on Aug. 31, 1998, Ser. No. 09/044,831, filed Mar. 20, 1998, Ser. No. 09/044,798, filed Mar. 20, 1998, and Ser. No. 09/328,648, filed on Jun. 9, 1999, all incorporated herein by reference herein.

Broadly, a precursor in the form of, e.g., a spin-on-glass composition that includes one or more removable solvents, is applied to a substrate, and then polymerized and subjected to solvent removal in such a way as to form a dielectric film comprising nanometer-scale voids.

When forming such nanoporous films, e.g., wherein the precursor is applied to a substrate by spin-coating, the film coating is typically catalyzed with an acid or base catalyst and water to cause polymerization/gelation ("aging") during an initial heating step. The film is then cured, e.g., by subjecting the film to one or more higher temperature heating steps to, inter alia, remove any remaining solvent and complete the polymerization process, as needed. Other curing methods include subjecting the film to radiant energy, e.g., ultraviolet, electron beam, microwave energy, and the like.

Co-owned application Ser. Nos. 09/291,510 and 09/291,511, both filed on Apr. 14, 1999, incorporated by reference herein, provide silicon-based precursor compositions and methods for forming nanoporous silica dielectric films by degrading or vaporizing one or more polymers or oligomers present in the precursor composition. Co-owned application Ser. No. 09/566,287, filed on May 5, 2000, provides silicon-based precursor compositions and methods for forming nanoporous silica dielectric films by degrading or vaporizing one or more compounds or polymers present in the precursor composition. U.S. Pat. No. 5,895,263 describes forming a nanoporous silica dielectric film on a substrate, e.g., a wafer, by applying a composition comprising decomposable polymer and organic polysilica i.e., including condensed or polymerized silicon polymer, heating the composition to further condense the polysilica, and decomposing the decomposable polymer to form a porous dielectric layer.

Processes for application of precursor to a substrate, aging, curing, planarization, and rendering the film(s) hydrophobic are described, for example, by co-owned U.S. Ser. No., 09/392,413, filed on Sep. 9, 1999, Ser. No. 09/054,262, filed on Apr. 3, 1998, and Ser. No. 09/140,855, filed on Aug. 27, 1998, among others.

Semiconductor Manufacturing Processes Remove Hydrophobic Groups

Undesirable properties result when the silica-based materials, such as the nanoporous silica dielectric films mentioned herein, form nanoporous films with surfaces, including surfaces of the pore structures, that contain silanol groups. Silanols, and the water that they can adsorb from the air are highly polarizable in an electric field, and thus will raise the dielectric constant of the film.

To make nanoporous films substantially free of silanols and water, one of two strategies is employed.

(A). In one method, an organic reagent, i.e., a surface modification agent, such as hexamethyldisilazane or methyltriacetoxysilane, is optionally introduced into the pores of the film to add organic, hydrophobic capping groups, e.g., trimethylsilyl groups.

(B) Films are produced from precursor compositions comprising starting reagents or precursors that advantageously produce hydrophobic silica dielectric films without further processing.

These processes are described, e.g., by co-owned U.S. Ser. No. 09/378,705, filed on Aug. 23, 1999, Ser. No. 09/140,855, filed on Aug. 27, 1998, Ser. Nos. 09/234,609 and 09/235,186, both filed on Jan. 21, 1999, the disclosures of which are incorporated by reference herein.

Etching and Plasma Remove Hydrophobic Functional Groups

Damage to nanoprous silica dielectric films during during semiconductor manufacturing processes results from the application of aggressive plasmas and/or etching reagents to etch trenches and vias into dielectric films. Plasmas are also used to remove photoresist films during fabrication of semiconductor devices (hereinafter referred to generally as intergrated circuits or "ICs". The plasmas used are typically composed of the elements oxygen, fluorine, hydrogen or nitrogen (in the form of free atoms, ions and/or radicals).

Dielectric films which are exposed to these plasmas during trench, via, etch and/or photoresist removal are easily degraded or damaged. Porous dielectric films have a very high surface area and are therefore particularly vulnerable to plasmas damage. In particular, silica based dielectric films which have organic content (such as methyl groups bonded to Si atoms) are readily degraded by oxygen plasmas. The organic group is oxidized into $CO_2$ and a silanol or Si—OH group remains on the dielectric surface where the organic group formerly resided. Porous silica films depend on such organic groups (on pore surfaces) to remain hydrophobic. Loss of the hydrophobicity makes the dielectric constant rise (the low dielectric constant of such films is the key desired property of such materials).

Wet chemical treatments are also used in IC production for the purpose of removing residues leftover after trench or via etching. The chemicals used are often so aggressive they will attack and remove organic groups in silica based dielectric films, especially porous silica films. Again, this damage will cause the films to lose their hydrophobicity. Wet chemical etchants include, for example, amides, such as N-methylpyrrolidinone, dimethylformamide, dimethylacetamide,; alcohols such as ethanol and 2-propanol; alcoholamines such as ethanolamine; amines such as triethylamine; diamines such as ethylenediamine and N,N-diethylethylenediamine; triamines such as diethylenetriamine, diamine acids such as ethylenediaminetetracetic acid "EDTA"; organic acids such as acetic acid and formic acid; the ammonium salts of organic acids such as tetramethylammonium acetate; inorganic acids such as sulfuric acid, phosphoric acid, hydrofluoric acid; fluoride salts such as ammonium fluoride; and bases such as ammonium hydroxide and tetramethyl ammonium hydroxide; and hydroxl amine; commercial formulations developed for post etch wet cleaning such as EKC 505, 525, 450, 265, 270, and 630 (EKC Corp., Hayward Calif.), and ACT-CMI and ACT-690 (Ashland Chemical, Hayward, Calif.). to name but a few art-known etchants.

There is also a need for a more rapid and efficient method of ensuring that newly produced silica dielectric films are hydrophobic to start with. Heretofore, as noted above, all such methods have employed liquid or vapor phase surface modification agents. No report of plasma phase surface modification agents and/or methods

SUMMARY OF THE INVENTION

In order to solve the above mentioned problems and to provide other improvements, the invention provides nanoporous silica dielectric films with a low dielectric constant ("k"), e.g., typically ranging from about 1.5 to about 3.8, as well as novel new methods of producing these dielectric films. Broadly, the invention provides methods of imparting hydrophobic properties to silica dielectric film(s) present on a substrate during the process of fabricating a semiconductor or IC device. As exemplified hereinbelow, the film is preferably formed from a methylhydridosiloxane precursor, although any other art-known silicon-based precursor, such as any commercial spin on glass (SOG), is readily employed.

Typically the damage to the silica dielectric film is produced by contact with at least one etchant or ashing reagent in such a way as to substantially damage or remove previously existing film hydrophobicity. Art-known etchants employed in IC fabrication include, for example, compositions that include one or more of the following types of agents: amides such as N-methylpyrrolidinone, dimethylformamide, dimethylacetamide; alcohols such as ethanol, 2-propanol; alcoholamines such as ethanolamine, and ethylenediamine; amines such as triethylamine; diamines such as N,N-diethylethylenediamine, triamines such as diethylenetriamine, amine-acids such as ethylenediaminetetracetic acid; organic acids such as acetic acid and formic acid; the ammonium salts of organic acids such as tetramethylammonium acetate; inorganic acids such as sulfuric acid, phosphoric acid, hydrofluoric acid; fluoride salts such as ammonium fluoride; and bases such as ammonium hydroxide and tetramethyl ammonium hydroxide; and hydroxl amine; commerical formulations developed for post etch wet cleaning such as EKC 505, 525, 450, 265, 270, and 630 (EKC Corp., Hayward Calif.), and ACT-CMI and ACT-690 (Ashland Chemical, Hayward, Calif.), and combinations thereof. Ashing agents include oxygen-derived plasmas, and the like.

The methods of the invention include, without limitation, the steps of (a) contacting the damaged silica dielectric film with a surface modification composition at a concentration and for a time period effective to render the silica dielectric film hydrophobic; and (b) removing unreacted surface modification composition, reaction products and mixtures thereof. The surface modification composition includes at least one surface modification agent, i.e., a compound or charged derivative thereof, suitable for removing silanol moieties from the damaged silica dielectric film.

Optionally, the etchant-damaged nanoporous silica dielectric film is subjected to wet cleaning prior to step (a).

In one embodiment, the surface modification composition includes at least one compound having a formula as follows:

$R_3SiNHSiR_3$, $RxSiCly$, $RxSi(OH)y$, $R_3SiOSiR_3$, $RxSi(OR)y$, $MpSi(OH)[4-p]$, $RxSi(OCOCH_3)y$ and combinations thereof, wherein x is an integer ranging from 1 to 3,
y is an integer ranging from 1 to 3 such that y=4−x,
p is an integer ranging from 2 to 3;
each R is an independently selected from hydrogen and a hydrophobic organic moiety;
each M is an independently selected hydrophobic organic moiety; and
R and M can be the same or different.

In another particular embodiment, the surface modification composition includes at least one of the following agents or compounds: acetoxytrimethylsilane, acetoxysilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorosilane, methylsilane, dimethylsilane, trimethylsilane, hexamethyldisilazane, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl (trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, and combinations thereof. As exemplified hereinbelow, the surface modification agent is the compound methyltriacetoxysilane.

Advantageously, the methods of the invention are readily applied to silica dielectric film that is either a nanoporous silica dielectric film, other foamed silica dielectric, or simply a nonporous silica dielectric. In a still further embodiment, the surface modification composition optionally includes a solvent. Suitable solvents include, for example, ketones, ethers, esters, hydrocarbons, and combinations thereof.

The surface modification composition is contacted with the damaged silica dielectric film as a liquid, vapor or gas, and/or plasma. If in the form of a plasma, the plasma can be derived from a silane compound, a hydrocarbon, an aldehyde, an ester, an ether, and/or combinations thereof.

It is also contemplated that the methods of the invention include methods of imparting hydrophobic properties to a silica dielectric film present on a substrate, whether a newly applied film or one damaged by fabrication processes or reagents. The method includes the steps of: (a) contacting the silica dielectric film with a plasma comprising at least one surface modification agent, at a concentration, and for a time period, effective to render the silica dielectric film hydrophobic; and (b) removing unreacted surface modification composition, reaction products and mixtures thereof, wherein the surface modification composition comprises at least one surface modification agent suitable for removing silanol moieties from the damaged silica dielectric film.

Semiconductor or IC devices manufactured using the above-described methods and reagents are also provided.

DETAILED DESCRIPTION OF THE INVENTION

Accordingly, as noted in the Background discussion, supra, certain reagents and methods have been described by co-owned, copending patent applications, for use in enhancing the pore surface hydrophobicity of nanoporous silica dielectric films during or immediately after film formation. It has now been unexpectedly found that certain surface modification reagents are useful for solving a newly appreciated problem, that of reversing damage to nanoporous silica dielectric films formed as part of a semiconductor device by subsequent manufacturing steps and reagents.

In order to better appreciate the scope of the invention, it should be understood that unless the "SiO$_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable starting material containing one or more silicon-based dielectric precursors. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired. The term, "film" as used herein with regard to silica dielectric materials is intended to encompass any other suitable form or shape in which such silica dielectric materials are optionally employed.

Additionally, the term "aging" refers to the gelling or polymerization, of the combined silica-based precursor composition on the substrate after deposition, induced, e.g., by exposure to water and/or an acid or base catalyst. Gelling is optionally applied to precursors selected to form foamed, i.e., nanoporous dielectric films, and/or nonporous dielectric films. Gelling can be accomplished by the above-described crosslinking and/or evaporation of a solvent.

The term "curing" refers to the hardening and drying of the film, after gelling, typically by the application of heat, although any other art-known form of curing may be employed, e.g., by the application of energy in the form of an electron beam, ultraviolet radiation, and the like.

The terms, "agent" or "agents" herein should be considered to be synonymous with the terms, "reagent" or "reagents," unless otherwise indicated.

A. Methods for Preparing Dielectric Films

Dielectric films, e.g., interlevel dielectric coatings, are prepared from suitable precursors applied to a substrate by any art-known method, including spin-coating, dip coating, brushing, rolling, spraying and/or by chemical vapor deposition. The precursor can be an organic polymer precursor, a silicon-based precursor and/or combinations thereof. The coating is then processed to achieve the desired type and consistency of dielectric coating, wherein the processing steps are selected to be appropriate for the selected precursor and the desired final product.

Typically, silicon-based dielectric films, including nanoporous silica dielectric films, are prepared from a suitable silicon-based dielectric precursor, e.g., a spin-on-glass ("S.O.G.") material blended with one or more solvents and/or other components. Prior to application of the base materials to form the dielectric film, the substrate surface is optionally prepared for coating by standard, art-known cleaning methods.

After the precursor is applied to the substrate surface, the coated surface is optionally contacted with a planarization object, i.e., in the form of a compression tool, for a time and at a pressure effective to transfer any desired pattern to the dielectric coating or film on the substrate surface, as described in detail in co-owned Ser. No. 09/549,659, filed Apr. 14, 2000, incorporated by reference herein.

B. Surface Modification Methods and Reagents

Reagents

A suitable surface modification composition includes one or more surface modification agents able to remove silanol groups from the surface of a silica dielectric film that it is desired to render hydrophobic. For example, a surface modification agent is a compound having a formula selected from the group consisting of Formulas I (1–8)

(1) $R_3SiNHSiR_3$, (2) $R_xSiCl_y$, (3) $R_xSi(OH)_y$, (4) $R_3SiOSiR_3$, (5) $R_xSi(OR)_y$, (6) $M_pSi(OH)_{[4-p]}$, (7) $R_xSi(OCOCH_3)_y$, (8) $R_xSiH_y$, and combinations thereof.

Further, x is an integer ranging from 1 to 3, y is an integer ranging from 1 to 3 such that y=4−x, p is an integer ranging from 2 to 3; each R is an independently selected from hydrogen and a hydrophobic organic moiety; each M is an independently selected hydrophobic organic moiety; and R and M can be the same or different. The R and M groups are preferably independently selected from the group of organic moieties consisting of alkyl, aryl and combinations thereof.

The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the surface modification agent is an acetoxysilane, or, for example, a monomer compound such as acetoxytrimethylsilane, acetoxysilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, and combinations thereof. As exemplified hereinbelow, one preferred surface modification agent is methyltriacetoxysilane.

Additional surface modification agents include multifunctional surface modification agents as described in detail in co-owned U.S. Ser. No. 09/235,186, incorporated by reference herein, as described above. Such multifunctional surface modification agents can be applied in either vapor or liquid form, optionally with or without co-solvents. Suitable co-solvents include, e.g., ketones, such as acetone, diisopropylketone, 2-heptanone, 3-pentanone, and others, as described in detail in co-owned U.S. Ser. No. 09/111,084, filed on Jul. 7, 1998, the disclosure of which is incorporated by reference herein. For example, as described in detail in U.S. Ser. No. 09/235,186, as incorporated by reference above, certain preferred surface modification agents will have two or more functional groups and react with surface silanol functional groups while minimizing mass present outside the structural framework of the film, and include, e.g., suitable silanols such as $R_1Si(OR_2)_3$  Formula II wherein $R_1$ and $R_2$ are independently selected moieties, such as H and/or an organic moiety such as an alkyl, aryl or derivatives of these. When $R_1$ or $R_2$ is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When $R_1$ or $R_2$ is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, $R_1$ or $R_2$ are independently selected from H, methyl, ethyl, propyl, phenyl, and/or derivatives thereof, provided that at least one of $R_1$ or $R_2$ is organic. In one embodiment, both $R_1$ and $R_2$ are methyl, and a tri-functional surface modification agent according to Formula V is methyltrimethoxysilane.

In another embodiment, a suitable silane according to the invention has the general formula of $R_1Si(NR_2R_3)_3$  Formula III wherein $R_1$, $R_2$, $R_3$ are independently H, alkyl and/or aryl. When any of $R_1$, $R_2$, $R_3$ are alkyl and/or aryl, they are defined as for $R_1$ and $R_2$ of Formula II, above. In preferred embodiments, $R_1$ is selected from H, $CH_3$, $C_6H_5$, and $R_2$ and $R_3$ are both $CH_3$. Thus tri-functional surface modification agents according to Formula III include, e.g., tris(dimethylamino)methylsilane, tris(dimethylamino)phenylsilane, and/or tris(dimethylamino)silane.

In yet another embodiment, a suitable silane according to the invention has the general formula of $R_1Si(ON=CR_2R_3)_3$  Formula IV wherein $R_1$, $R_2$, $R_3$ are independently H, alkyl and/or aryl. When any of $R_1$, $R_2$, $R_3$ are alkyl and/or aryl, they are defined as for Formula II, above. In one preferred embodiment, $R_1$ and $R_2$ are both $CH_3$, and $R_3$ is $CH_2CH_3$. Thus tri-functional surface modification agents according to Formula IV include, e.g., methyltris(methylethylkeoxime)silane.

In yet a further embodiment, a suitable silane according to the invention has the general formula of $R_1SiCl_3$  Formula V wherein $R_1$ is H, alkyl or aryl. When $R_1$ is alkyl and/or aryl, they are defined as for Formula II, above. In one preferred embodiment, $R_1$ is $CH_3$. Thus tri-functional surface modification agents according to Formula V include, e.g., methyltrichlorosilane.

In a more preferred embodiment, the capping reagent includes one or more organoacetoxysilanes which have the following general formula, $(R_1)_xSi(OCOR_2)_y$  Formula VI Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof.

Methods

Optionally, the surface modification agent or agents are mixed with a suitable solvent such as 2-heptanone, applied to the nanoporous silica surface in the form of a vapor or liquid, and then dried.

In an alternative embodiment, surface modification is provided by exposing the etchant-damaged silica dielectric film to a plasma which is derived from any of the above mentioned surface modification reagents. In a typical procedure, the dielectric film is placed in a plasma generating chamber, such as a plasma enhanced chemical vapor deposition (PECVD) system; the vapor of a surface modification reagent and argon vapor are passed through the plasma generating chamber; then an RF energy source is activated to create a plasma; the argon gas is included to help promote the formation of plasma. The plasma is composed of ionic fragments derived from the surface modification reagent; for example, the ion fragment $CH_3Si^+$ is generated from methylsilane ($CH_3SiH_3$). This fragment reacts with silanol groups to form hydrophobic Si—CH$_3$ moieties. Any of the above mentioned surface modification reagents can be used for this plasma induced surface treatment. The most preferred silane reagent is methylsilane.

Other suitable surface modification reagents for a plasma induced surface modification treatment include C$_1$–C$_{12}$ alkyl and aromatic hydrocarbons. The most preferred hydrocarbon is methane. Other reagents for plasma induced surface modification include aldehydes, esters, acid chlorides, and ethers. Suitable aldehydes include acetaldehyde and benzaldehyde; suitable esters include ethylacetate and methyl benzoate; suitable acid chlorides include acetyl chloride and benzyl chloride; and suitable ethers include diethyl ether and anisole. A wide variety of single wafer or multiple wafer (batch) plasma systems can be used for this process; these systems include so called downstream ashers, such as the Gasonics L3510 photoresist asher, PECVD dielectric deposition systems such as the Applied Materials P5000, or reactive ion etch ("RIE") systems.

Broadly, the conditions for the plasma process are within the following ranges: chamber temperature, 20 C to 450° C.; RF power, 50 W to 1000 W; chamber pressure, 0.05 to 100 torr; plasma treatment time, 5 seconds to 5 minutes; and surface modification flow rate, 100–2000 sccm; inert gas flow rate (typically argon), 100–2000 sccm.

The artisan will appreciate that the invention is also contemplated to encompass methods of imparting a hydrophobic surface to silica dielectric films, porous and/or nonporous, whether damaged or not, by application of the above-described plasma surface treatmetns. Semiconductor devices or ICs manufactured using these methods are also a part of the present invention.

EXAMPLES

Thickness and Refractive Index of Films: In the following examples, ellipsometry was also used to determined the thickness and refractive index (RI) of the produced film.

Dielectric Constant of Films: In the following examples, the dielectric constant (k) was determined from a measurement of the capacitance of a metal-insulator-metal (MIM) structure at 20 C. The MIM structure is formed by sputtering aluminum onto the film, which is coated on a low resistivity Si wafer (0.25 ohms-cm) through a circular dot mask. An appropriately biased voltage was applied to the MIM structure, and the capacitance (C) across the structure was then measured at 1 MHz. The area (A) of the aluminum dot was measured by light microscope-micrometry. The thickness (Th) of the film near the aluminum dot was measured by ellipsometry. The k value is then calculated from:

$$k=(C*Th)/\in *A$$

wherein $\in$ is the permittivity of free space ($8.86*10^{-14}$F/cm).

Example 1

Formation of Nanoporous Silica Film Treated with MTAS

A nanoporous silica precursor was synthesized as described by co-owned U.S. Ser. No. 09/235,186, filed on Jan. 22, 1999, incorporated by reference herein. Thus, the precursor was prepared by adding 208 mL of tetraethoxysilane, 94 mL of triethyleneglycol monomethyl ether(TriEGMME), 16.8 mL deionized water, and 0.68 mL of 1N nitric acid together in a round bottom flask. The solution was allowed to mix vigorously and heated (heating and stirring were begun at the same time) to about 80° C. and refluxed for 1.5 hours, to form a clear solution. The resulting solution was allowed to cool down to room temperature and then it was diluted 25% by weight with ethanol, and filtered through a 0.1 micron Teflon® filter.

About 2 mL of the nanoporous silica precursor was deposited onto a 4" silicon wafer and then spun at 2500 rpm for 30 seconds. Then the film was gelled/aged in a vacuum chamber using the following conditions:

1. The chamber was evacuated to 250 torr.
2. 15 M ammonium hydroxide was heated and equilibrated at 45° C. and introduced into the chamber to increase the pressure to 660 torr for 4 minutes.
3. The chamber was refilled with air and the film was removed from the chamber for surface treatment/solvent exchange.

The surface treatment/solvent exchange of the film was carried out using the following conditions:

1. The reagent used for the surface modification was prepared by mixing 5 grams of methyltriacetoxysilane, "MTAS", (Gelest, Tullytown, Pa. 19007) with 95 grams of 3-pentanone to form a clear colorless solution.
2. The aged film was put on the spinning chuck and spun at 250 rpm.
3. About 30 mL of the above MTAS solution was spun on the film without allowing the film to dry for 20 seconds.
4. Then the film was spun dry at 2500 rpm for 10 second and then the film was removed from the chuck and subjected to heat treatment, as follows.

The film obtained from the above process was then heated at 175 and 320° C., under air, for 60 seconds for each step, respectively. Then it was cured in a furnace at 400° C. for 30 minute under nitrogen. Testing of film properties was conducted as described supra, and the measured physical properties are reported in Example 9, below.

Example 2

Formation of Non-Porous Methylhydridosiloxane Film

A precursor composition was prepared as described by U.S. patent application Ser. No. 09/044,798, filed on Mar. 20, 1998, the disclosure of which is incorporated by reference herein. Thus, a one liter jacketed reactor equipped with a nitrogen inlet, dry ice condenser and a mechanical stirrer was charged with 1000 mL hexanes, 80 mL ethanol, 25 mL water and 61.3 g Amberjet 4200 catalyst (Rohn & Haas Co.). The mixture was equilibrated for 0.5 hr with stirring at 25° C. (circulating bath). A mixture of trichlorosilane (14.3 mL, 0.142 Mol) and methyltrichlorosilane (66.7 mL, 0.568 Mol) was added to the reactor using a peristaltic pump over a period of 35 minutes. Upon completion of the silane addition, hexane was pumped through the lines for 10 minutes. The reaction was stirred for 23 hours, then filtered through a Whatman #4 filter. The filtered solution was placed in a separatory funnel and the water/ethanol layer removed. The remaining hexane solution was dried over 4 Å molecular sieves (170 g) for 5 h and then filtered through a 1 mm filter. The hexanes were removed using a rotary evaporator to give a white solid product (23.1 g), 52% yield. The GPC of this product, referenced to polystyrene standards gave a Mw of 11,885 with a polydispersity of 6.5.

The above precursor was used to form a nanoporous dielectric silica film on a substrate as described by U.S. patent application Ser. No. 09/227,498, filed on Jan. 7, 1999, the disclosure of which is incorporated by reference herein. Thus, methyl isobutyl ketone (MIBK) (63.5 g) was dried over 4 Å molecular sieves and combined with 14 g of the non-porous methylhydridosiloxane. The solution was filtered to 0.2 mm. The solution was coated on a bare 4 inch silicon wafer using a conventional spin coater. Approximately 3 ml of the polymer solution was placed on the wafer. After a 3 second delay, the wafer was spun at 2000 rpm for 20 seconds. The coated wafer was baked on three successive hot plates for one minute each at 150° C., 200° C., and 350° C., respectively. The baked wafer was then cured in a nitrogen atmosphere in a horizontal furnace set initially at 300° C., followed by a ramp to 380° C. at a rate of 4° C./minute, where it was held for 10 minutes, then increased to 400° C. at a rate of 1° C./minute. The furnace temperature was held at 400° C. for one hour and then lowered back to 300° C. over a period of about 2 hours. The properties of the completed film (before ashing treatment, see example 9) were as follows:

|  | Thickness | RI | k | C—H Abs. | Si—H Abs. |
| --- | --- | --- | --- | --- | --- |
| Before Ashing | 4020 Å | 1.362 | 2.5 | 0.20 | 0.05 |

Example 3

Photoresist Ashing

The wafer coated with nanoporous silica in Example 1 is placed within the chamber of a TEL 85 DRM L3510 etcher. Pure oxygen is made to flow through the chamber at less than 500 sccm. The wafer temperature is 25° C. An RF plasma source is activated at a power consumption level of 500 W for a period of 1 minute. During this 1 minute period the film is exposed to a plasma derived from oxygen. The total pressure during this process is less than 500 millitorr. The predicted film properties before and after this ashing treatment are:

TABLE 2

|  | Thickness | RI | k | C—H Abs. |
| --- | --- | --- | --- | --- |
| Before | 7050 Å | 1.165 | 2.2 | 0.15 |
| After | 6960 | 1.160 | 3.8 | 0.02 |

Fourier transform infrared ("FTIR") spectroscopy confirms that the O—H absorption curve is increased in amplitude at about 3500 cm$^{-1}$ in films subjected to the ashing treatment, relative to untreated (non-ashed) films. This confirms that the ashing treatment removes most of the C—H bonds attributable to the methyl groups in the original film. It has previously been confirmed (see, for example, co-owned U.S. Ser. No. 09/235,186, incorporated by reference, supra)that the relative amplitude of the O—H absorption peak is predictive of the relative k values of the resulting film(s), all other parameters being equal.

Example 4

Wet Cleaning

The nanoporous silica coated wafer processed through the ashing treatment in Example 3 is immersed in a wet cleaning solution (EKC 630, a proprietary post-etch wet cleaning solution from EKC Corp, Hayward, Calif.)) for 20 minutes at a temperature of 70° C. The wafer is then immersed in 2-propanol for 30 seconds, and then immersed in water for 30 seconds. Finally, the wafer was heated on successive hot plates set at 175 and 320° C. (1 minute each plate). The film properties before and after this wet cleaning treatment are shown below in Table 3.

TABLE 3

|  | Thickness | RI | k | C—H Abs. |
| --- | --- | --- | --- | --- |
| Before | 6960 Å | 1.160 | 3.8 | 0.02 |
| After | 7015 | 1.172 | 7.9 | 0.00 |
| After 425° C. + 1 hr | 6930 | 1.159 | 4.1 | 0.00 |
| After 425° C. + 1 d | 7035 | 1.167 | 6.4 | 0.00 |

The film has absorbed more water as indicated by the higher k value and higher refractive index after the wet cleaning treatment/IPA/water/175° C./320° C. process. The wafer was then heated at 425° C. in a furnace (nitrogen atmosphere) for 30 minutes. The k was 4.1 one hour after the 425° C. treatment. The film absorbed water during the one day following the 425° C. heating step as indicated by the increase of k to 6.4.

Example 5

Restoring Hydrophobicity and Low K Using MTAS Solution

A nanoporous silica film is produced according to Example 1, and the same film is treated with the ashing process of Example 3 and the then wet cleaning process of Example 4 (not including the 425° C. furnace treatment). The wafer coated with this film is immersed in a solution composed of methyltriacetoxysilane (MTAS), 15% wt/wt, and 2-heptanone, 85% wt/wt.; the temperature of the solution is 20° C.; the duration of immersion is 10 minutes. The wafer is removed from the MTAS containing solution, and then it is placed on a spin coater. To remove reaction by products and unreacted MTAS, the wafer is spun at 3000 rpm for 1 minute while pure 2-heptanone is dispensed onto the center of the wafer. A total of 30 ml of 2-heptanone is dispensed during this 1 minute spin. To remove residual 2-heptanone, the wafer is heated successively on hot plates at 175 C for 1 minute, and then at 320 C for 1 minute (both in an air atmosphere). The predicted properties of the film are shown below in Table 4, as follows.

TABLE 4

|  | Thickness | RI | k | C—H Abs. |
| --- | --- | --- | --- | --- |
| Before Ash & Cleaning | 7085 Å | 1.165 | 2.2 | 0.16 |
| After Ash & Cleaning | 6960 Å | 1.159 | 9.1 | 0.00 |
| After MTAS | 7015 | 1.169 | 2.2 | 0.15 |

Restoration of the low dielectric constant is achieved by this MTAS solution treatment performed after the ash and wet clean steps. The MTAS solution treatment returns methyl content into the film as indicaed by the FTIR C—H absorption, and the film is hydrophobic as indicated by the very low O—H absorption. The k is once again 2.2.

Example 6

Restoring Hydrophobicity and Low Using MTAS Vapor

A nanoporous silica film is produced according to Example 1, and the same film is treated with the ashing process of Example 3 and the wet cleaning process of Example 4 (not including the 425° C. furnace treatment). The wafer coated with this film is placed inside a cylindrical chamber made of aluminum (225 mm inside diameter, 30 mm inside height). The chamber is contained inside a chemical fume hood. There is a synthetic rubber gasket between the top edge of the chamber and the chamber lid. The chamber is heated by use of electrical heating tape bonded to the outer chamber surfaces and to the lid. There are four stainless steel (¼ inch inside diameter) tubes connected to the reaction chamber; and each tube has a stainless steel valve. One tube is connected to a vacuum pump; another is connected to the MTAS reservoir; and the third tube serves as a vent line; the fourth tube connects to a vacuum gauge. The MTAS reservoir is a stainless steel, 1 liter volume, cylinder. The latter contains about 100 g of MTAS; the outer surface of the MTAS reservoir is heated to 70° C. using heating tape. The chamber is also heated to about 70° C. The chamber is evacuated to about 1 torr and then the valve to the vacuum pump is closed. Next, the valve to the MTAS reservoir is opened so the MTAS vapor enters the chamber. After five minutes, the MTAS chamber valve is closed and the vacuum valve is opened. After 1 minute, the vacuum valve is closed and the vent valve is opened to let air into the chamber. The wafer is then removed and analyzed, and the predicted properties of the films are shown below in Table 5.

TABLE 5

|  | Thickness | RI | k | C—H Abs. |
|---|---|---|---|---|
| Before Ash & Cleaning | 7025 Å | 1.167 | 2.2 | 0.17 |
| After Ash & Cleaning | 6990 | 1.159 | 7.5 | 0.00 |
| After MTAS Vapor | 7060 | 1.170 | 2.3 | 0.17 |

The MTAS vapor treatment returns methyl content into the film as indicated by the FTIR C—H absorption, and the film is hydrophobic as indicated by the very low FTIR O—H absorption. The dielectric constant is also now very low again.

Example 7

Restoring Hydrophobicity & Low K Using Carbon-Based Plasma

A nanoporous silica film is produced according to Example 1, and the same film is treated with the ashing process of Example 3 and the wet cleaning process of Example 4 (not including the 425° C. furnace treatment). The wafer coated with this film is placed inside a Gasonics L3510 photoresist asher. The asher chamber is evacuated to 200 mtorr and methane ($CH_4$) gas is allowed to flow through the chamber at this pressure. The methane flow rate is 500 sccm. The asher is maintained at about 20° C. Then the RF source of the chamber is activated; the power setting is 100 W, and the RF frequency is 13.56 MHz. After 2 minutes, the RF source is deactivated, and the methane gas flow is reduced to zero. The asher chamber is then vented with air, and the wafer is removed for analysis of the film. Table 6, below, shows the predicted properties of the films.

TABLE 6

|  | Thickness | RI | k | C—H Abs. |
|---|---|---|---|---|
| Before Ash & Cleaning | 7135 Å | 1.163 | 2.2 | 0.17 |
| After Ash & Cleaning | 7045 | 1.158 | 10.3 | 0.00 |
| After C-Based Plasma | 7090 | 1.174 | 2.2 | 0.20 |

The carbon based plasma treatment re-incorporates organic content into the film as indicated by the C—H FTIR absorption. The low k property and hydrophobicity are also restored; the FTIR shows a very small O—H absorption.

Example 8

Restoring Hydrophobicity and Low K Using Silane Based Plasma

A nanoporous silica film is produced according to Example 1, and the same film is treated with the ashing process of Example 3 and the wet cleaning process of Example 4 (not including the 425° C. furnace treatment). The wafer coated with this film is placed inside a plasma enhanced chemical vapor deposition chamber (PECVD), Applied Materials P5000. Methylsilane ($CH_3SiH_3$) is used as the reagent for creating a hydrophobic pore surface. Argon gas is used to promote the creation of a plasma. The RF plasma source is activated for a period of 20 seconds. The conditions employed during this period are detailed in Table 7, as follows.

TABLE 7

| RF power: | 700 W |
|---|---|
| CH3SiH3 flow rate: | 500 sccm |
| Argon flow rate: | 1200 sccm |
| Chuck temperature: | 400° C. |
| Chamber pressure: | 10 torr |

The wafer is removed from the chamber and then analyzed, and the predicted properties of the films are provided by Table 8, below.

TABLE 8

|  | Thickness | RI | k | C—H Abs. |
|---|---|---|---|---|
| Before Ash & Cleaning | 7010 Å | 1.160 | 2.1 | 0.13 |
| After Ash & Cleaning | 6930 | 1.158 | 6.9 | 0.00 |
| After Silane Plasma | 7090 | 1.170 | 2.2 | 0.18 |

After the silane plasma treatment the film is hydrophobic as indicated by the low k value and the very low O—H absorption in the FTIR spectrum. The C—H absorption in the FTIR shows that organic content has been added to the film.

Example 9

Restoring Hydrophobicity and Low K for Non-Porous Silsesquioxane Using MTAS Solution A silsesquioxane film is formed on a wafer as in Example 2. This film coated wafer is processed through photoresist ashing and wet cleaning treatments as in Examples 3 and 4. The film coated wafer is then exposed to an MTAS solution to restore its hydrophobicity and low k properties; The procedure for MTAS solution treatment of Example 5 is used. The properties of the film before and after these treatments are shown by Table 9, below.

TABLE 9

|  | Thickness | RI | k | C—H Abs. | Si—H Abs. |
|---|---|---|---|---|---|
| Before Ashing | 4020 Å | 1.362 | 2.5 | 0.20 | 0.05 |
| After Ashing | 3650 | 1.410 | 3.2 | 0.10 | 0.025 |
| After wet cleaning | 3650 | 1.410 | 3.2 | 0.10 | 0.025 |
| After 400° C./1 hr | 3600 | 1.390 | 3.0 | 0.1 | 0.025 |
| After MTAS treatment | 3690 | 1.37 | 2.6 | 0.15 | 0.025 |

Restoration of the low dielectric constant is achieved by this MTAS solution treatment performed after the ash and wet clean steps. The FTIR spectrum exhibits an O—H absorption after the ash and wet clean treatment, and reduced C—H and Si—H absorptions; the k is also higher. After the MTAS treatment the k value is 2.6, very close to the original value before ashing; the C—H absorption is also higher, which indicates that methyl groups from MTAS have been added to the film; and the film is hydrophobic again as indicated by the absence of a O—H absorption.

Example 10

Fabrication of Damascene Trench Structure Using Nanoporous Silica

This example illustrates the application of the inventive process to fabrication of a damascene trench structure incorporating a nanoporous silica dielectric material.

Figure 1A:
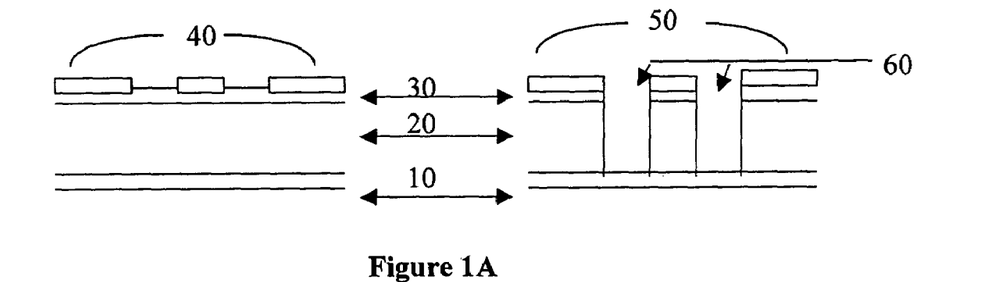
FIG. 1A illustrates a cross-section schematic of a nanoporous silica dielectric film on a silicon nitride layer, with a photoresist patter (left) and the topology resulting from the etching process (right).
Figure 1B:
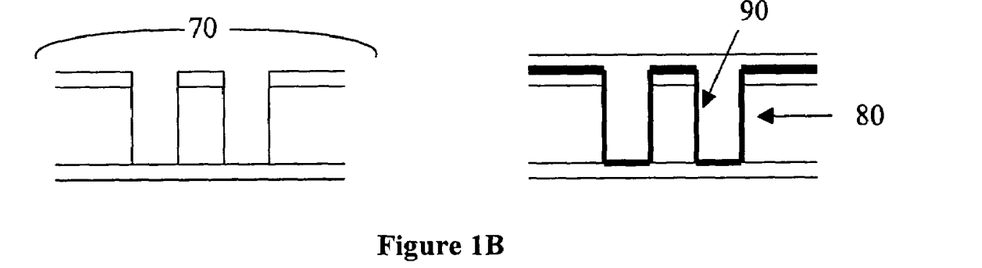
FIG. 1B illustrates a cross-section schematic of a nanoporous silica dielectric film on a silicon nitride layer, with a copper conductor pattern and Ta barrier (right).
Figure 1C:
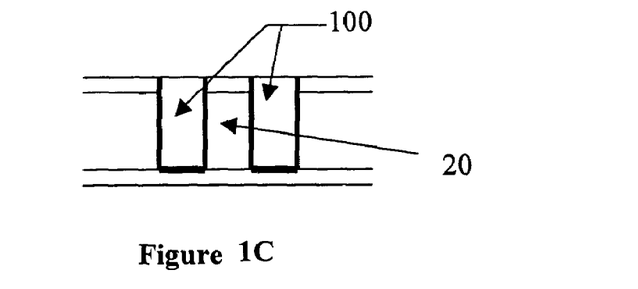
FIG. 1C illustrates the same pattern as for 1B, after chemical mechanical polishing.

The example is described with reference to FIGS. 1A, 1B and C. A 200 mm Si wafer is oxidized by art known methods to form an $SiO_2$ layer (5000 Å) on the top surface of the wafer. The wafer is then coated with a layer (10) of PECVD silicon nitride, SiN, (1000 Å). Next, a layer of nanoporous silica (20) (7000 Å) is coated on the same wafer according to the procedure in Example 1 (the entire process through and including the 400° C. furnace step). Another layer (30) of PECVD silicon nitride (500 Å) is then deposited on the nanoporous silica layer. A photoresist coating or pattern (40) is then applied to this stack of dielectric layers, and the photoresist is processed in the customary manner to form a pattern of lines and spaces (50).

An anisotropic etching process is then performed to create the trenches (60), that are 0.13 microns in width. The etching is performed in a plasma etching chamber, in which $CF_4$ is the primary etch gas, and in which there is a sufficient bias voltage to cause anisotropic (downward) etching. The photoresist layer is removed by oxygen based plasma treatment ("ashing" as in Example 3) to create the structure of (70) in FIG. 1B. It is in this ashing step that the nanoporous silica is chemically altered; the oxygen plasma species remove the methyl groups from the pore surfaces by oxidation reactions; the resulting pore surfaces become hydrophilic. A wet cleaning process is also performed after the ashing step (as in Example 4).

Next, a Tantalum (Ta) barrier liner film (250 Å) (80) is deposited into the trenches and over the top SiN layer; this deposition is performed using the physical vapor deposition (sputtering) technique. A Cu "seed layer", not shown, is deposited by sputtering Cu onto the Ta layer. Then the trenches are filled with electroplated Cu (90). In the final step, the excess Cu and the Ta liner on top of the SiN layer are removed by chemical mechanical polishing to form the structure of FIG. 1C, showing the copper lines (100) and the nanoporous silica dielectric (20).

Figure 2:
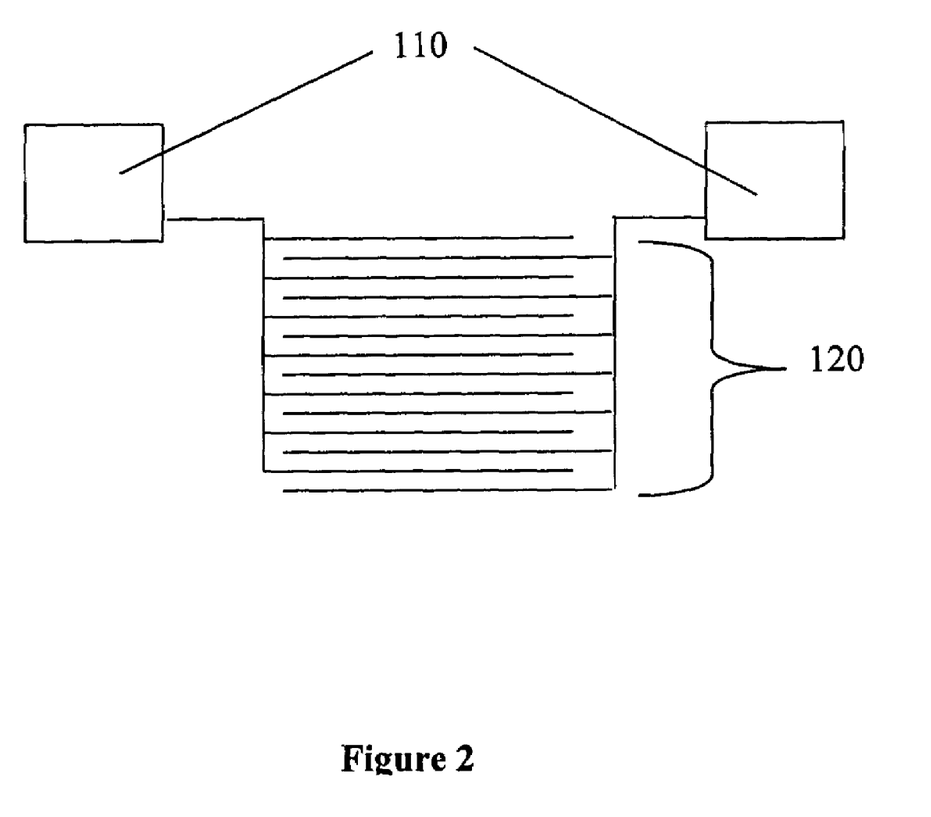
FIG. 2 illustrates the top surface of the wafer produced by Example 10.

A view of the top surface of the wafers in FIG. 2 shows that the inlaid Cu contains the pattern shown in FIG. 1C; the dimensions depicted in this drawing are not proportional to the actual structure. There are two large square probe pads (110) (each 100 micron×100 micron). Each probe pad is connected to a "comb" of parallel lines (120); the width of each line is 0.13 μm.

The two combs are "interdigitated" such that a line from one comb is in between and parallel to two of the lines from the other comb. The lines are 1000 μm long. There are 101 lines in each comb (for simplicity only 7 lines are shown in the figure); There are 200 parallel capacitors in this interdigitated comb structure (2*(101−1)=200). The dielectric constant (k) for the nanoporous silica residing between the Cu lines is calculated by the following equation for a parallel plate capacitor:

$$C = k * \in * A/d$$

C=capacitance
∈=permittivity of free space=$8.86 \times 10^{-14}$ F/cm
A=area of each parallel plate=height×length=0.7 μm ×1000 μm=700 μm² = $7 \times 10^{-6}$ cm²
d=distance between the plates=0.13 μm=$1.3 \times 10^{-5}$ cm To calculate k from a measured capacitance value, the above equation is rearranged to:

$$k = (C/200) * d/(\in * A)$$

Given the very large area of the parallel lines, the effects the substrate and the probe pads on the measured capacitance are ignored in the calculation of k. The capacitance is divided by 200 because there are 200 parallel plate capacitors in the interdigitated comb structure. The total capacitance in the comb structure is measured by connecting the probe pads to a capacitance meter and then applying a voltage across the two pads. Table 10, below, shows predicted results of capacitance measurements for structures shown in FIGS. 1C and 2, which are treated with MTAS solution for hydrophobicity (see Example 5, supra) after the wet photoresist ashing and cleaning steps. Predicted values for structures not treated with MTAS solution are also shown.

TABLE 10

| Process | Predicted Capacitance (Farads) | Calculated k |
|---|---|---|
| With MTAS solution treatment | $24 \times 10^{-12}$ | 2.5 |
| Without MTAS solution treatment | $60 \times 10^{-12}$ | 6.3 |

The data shows that the predicted interline capacitance and the calculated k are almost 3 times greater for the structure which does not receive the MTAS solution treatment following the ashing and wet clean steps. A structure treated with MTAS is predicted to have a k value of 2.5 for the nanoporous silica and SiN dielectric composite. This k value is slightly higher than the k value (2.2) of the unpatterned nanoporous film made in Example 1. In the present example, the measured capacitance is affected by both the thick nanoporous silica 7000 Å film and the thin 500 Å silicon nitride film, both of which reside between the Cu lines. The approximate k value for PECVD SiN is about 7.0. Thus, the dilectric constant of the composite dielectric stack (nanoporous silica and SiN) is slightly higher than 2.2.

What is claimed is:

1. A method of imparting hydrophobic properties to a damaged silica dielectric film present on a substrate, wherein said dielectric film has been contacted with at least one etchant or ashing reagent in such a way as to substantially damage or remove previously existing hydrophobicity of said dielectric film, the method comprising
    (a) contacting the damaged silica dielectric film with a surface modification composition at a concentration and for a time period effective to render the silica dielectric film hydrophobic; and
    (b) removing unreacted surface modification composition, reaction products and mixtures thereof,
wherein the surface modification composition comprises at least one surface modification agent suitable for removing silanol moieties from the damaged silica dielectric film.

2. The method of claim 1 wherein the etchant-damaged silica dielectric film is subjected to wet cleaning prior to step (a).

3. The method of claim 1 wherein the surface modification composition comprises at least one compound having a formula selected from the group consisting of:

$R_3SiNHSiR_3$, $RxSiCly$, $RxSi(OH)y$ $R_3SiOSiR_3$, $RxSi(OR)y$, $MpSi(OH)[4-p]$, $RxSi(OCOCH_3)y$ and combinations thereof, wherein x is an integer ranging from 1 to 3,
y is an integer ranging from 1 to 3 such that y=4−x,
p is an integer ranging from 2 to 3;
each R is an independently selected from hydrogen and a hydrophobic organic moiety;
each M is an independently selected hydrophobic organic moiety; and
R and M can be the same or different.

4. The method of claim 1 wherein the surface modification composition comprises at least a compound selected from the group consisting of, acetoxytrimethylsilane, acetoxysilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, 2-trimethylsiloxypent-2-ene-4-onc, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, and combinations thereof.

5. The method of claim 4 wherein the surface modification composition comprises methyltriacetoxysilane.

6. The method of claim 1 wherein the silica dielectric film is either nanoporous or non-porous.

7. The method of claim 1 wherein the silica dielectric film is a methylhydridosiloxane film.

8. The method of claim 1 wherein the surface modification composition comprises a solvent selected from the group consisting of ketones, ethers, esters, hydrocarbons, and combinations thereof.

9. The method of claim 1 wherein the etchant is a plasma comprising atoms, ions and/or radicals selected from the group consisting of oxygen, fluorine, hydrogen, nitrogen and combinations thereof.

10. The method of claim 1 wherein the etchant is a wet etchant that comprises at least one agent selected from the group consisting of an amide, an alcohol, an alcoholamine, an amine, a triamine, an acid, a base and combinations thereof.

11. The method of claim 10 wherein the amide is selected from the group consisting of N-methylpyrrolidinone, dimethylformamide, dimethylacetamide and combinations thereof.

12. The method of claim 10 wherein the alcohol is selected from the group consisting of ethanol 2-propanol and combinations thereof.

13. The method of claim 10 wherein the etchant comprises at least one agent selected from the group consisting of ethanolamine, ethylenediamine, triethylamine, N,N-diethylethylenediamine, diethylenetriamine, amine, ethylenediaminetetracetic acid; organic, acetic acid, formic acid, tetramethylammonium acetate, sulfuric acid, phosphoric acid, hydrofluoric acid; ammonium fluoride, ammonium hydroxide, tetramethyl ammonium hydroxide, hydroxl amine and combinations thereof, provided that the combinations are of agents that do not neutralize one another.

14. The method of claim 1 wherein the surface modification composition is contacted with the damaged silica dielectric film in a state selected from the group consisting of liquid, vapor or gas, and plasma.

15. The method of claim 14 wherein a plasma derived from a silane compound is used as the surface modification composition.

16. The method of claim 14 wherein the surface modification composition is a plasma derived from a compound selected from the group consisting of a hydrocarbon, an aldehyde, an ester, an ether, and combinations thereof.

* * * * *